United States Patent

Dowd et al.

(10) Patent No.: US 6,639,931 B1
(45) Date of Patent: Oct. 28, 2003

(54) LASER DEVICES

(75) Inventors: Philip Dowd, Bristol (GB); Ian Hugh White, Bath (GB); Richard Vincent Penty, Bristol (GB); Peter John Heard, Bristol (GB); Geoffrey Charles Allen, Bristol (GB); Michael Renne Ty Tan, Menlo Park, CA (US)

(73) Assignee: University of Bristol, Bristol (GB)

( * ) Notice: Subject to any disclaimer, the term of this patent is extended or adjusted under 35 U.S.C. 154(b) by 0 days.

(21) Appl. No.: 09/424,011

(22) PCT Filed: May 15, 1998

(86) PCT No.: PCT/GB98/01415

§ 371 (c)(1),
(2), (4) Date: Mar. 29, 2000

(87) PCT Pub. No.: WO98/53537

PCT Pub. Date: Nov. 26, 1998

(30) Foreign Application Priority Data

May 17, 1997 (GB) .............................................. 9709949

(51) Int. Cl.[7] .............................................. H01S 3/08
(52) U.S. Cl. .............................. 372/96; 372/96; 372/29; 372/45; 372/46; 372/50; 372/70; 372/75; 372/99
(58) Field of Search ................................ 372/96, 75, 70, 372/29, 50, 45, 46, 99

(56) References Cited

U.S. PATENT DOCUMENTS

| | | | |
|---|---|---|---|
| 5,293,392 A | * | 3/1994 | Shieh et al. .................. 372/45 |
| 5,331,654 A | | 7/1994 | Jewell et al. |
| 5,412,680 A | | 5/1995 | Swirhun et al. |
| 5,469,458 A | | 11/1995 | Numai |
| 5,568,499 A | * | 10/1996 | Lear .............................. 372/45 |
| 5,729,563 A | * | 3/1998 | Wang et al. .................. 372/50 |
| 5,757,836 A | * | 5/1998 | Jiang et al. .................... 372/50 |
| 5,953,362 A | * | 9/1999 | Pamulapati et al. .......... 257/14 |
| 6,185,240 B1 | * | 2/2001 | Jiang et al. .................... 372/50 |

FOREIGN PATENT DOCUMENTS

EP  0772269 A1  5/1997

OTHER PUBLICATIONS

A. Chavez–Pirson et al., "Polarization Properties of a Vertical Cavity Surface Emitting Laser Using a Fractional Layer Superlattice Gain Medium", *Applied Physics Letters*, vol. 62, Jun. 1993, pp. 3082–3084.

Toshikazu Mukaihara et al., "Polarization Control of Vertical–Cavity Surface–Emitting Lasers Using a Birefringent Metal/Dielectric Polarizer Loaded on Top Distributed Bragg Reflector", *IEEE Journal of Selected Topics in Quantum Electronics*, vol. 1, No. 2, Jun. 1, 1995, pp. 667–673.

* cited by examiner

*Primary Examiner*—Paul Ip
*Assistant Examiner*—Delma R. Flores Ruiz
(74) *Attorney, Agent, or Firm*—Townsend and Townsend and Crew LLP

(57) ABSTRACT

A vertical cavity surface emitting laser device (10) has a discontinuity (11) formed within the body of the device. When the device is in use, the direction of polarization of light emitted from the device is substantially aligned with a boundary of the discontinuity.

24 Claims, 9 Drawing Sheets

LASER DEVICES

The present invention relates to laser devices, and in particular to vertical cavity surface emitting laser (VCSEL) devices such as VCSEL diodes.

BACKGROUND OF THE INVENTION

Laser devices, such as laser diodes, are being increasingly used in a variety of applications, such as communications and data storage devices. One type of laser diode is the vertical cavity surface emission laser diode (VCSEL), and a typical example is shown in plan view in FIG. 1 and in side cross-sectional view in FIG. 2 of the accompanying drawings. The VCSEL 1 comprises a substrate 7, which carries a lower electrical contact 8. An active region 6 is sandwiched between upper and lower distributed Bragg reflector (DBR) mirror structures 4 and 5, the lower mirror structure being carried by the substrate 7. The mirror structures 4 and 5 provide high reflectivity, for example around 99.5%. The upper DBR mirror structure 4 includes a proton implant area 9. The proton implant area 9 serves to confine current supplied to the device.

An upper electrical contact 3 is provided on the upper surface of the upper mirror structure 4. The upper contact 3 defines an aperture 2 through to the upper surface of the upper mirror structure 4.

The VCSEL 1 of FIGS. 1 and 2 produces a light output which is emitted in the direction of arrow A through the aperture 2. The output light is produced by a lasing effect or laser action in the active region 6 between the two DBR mirrors 4 and 5, as is well known.

One of the main advantages of VCSEL devices is that the light output is produced in a direction perpendicular to the plane of the device. This is in contrast to previous edge emitting laser diodes which emit light in the plane of the device. Thus, VCSEL devices can easily be manufactured into arrays, since a number of devices can be produced on a single semiconductor area, without the need for the devices to be cut from one another. In addition, VCSELs are particularly suited for producing a circular beam of light. Such a circular beam requires little or no further optical processing before application to devices, such as CD ROM drives or communications devices.

However, laser emission in VCSELs can often allow orthogonal or elliptical polarisation states, with incomplete control of the orientation of the axes of polarisation or the polarisation state of individual lasing modes or filaments, which may also vary with the bias current. This can also result in the orientation of the polarisation axes varying from device to device even between adjacent lasers fabricated from the same wafer.

There is much interest in the use of vertical-cavity surface-emitting lasers (VCSELs) for a variety of applications including optical storage, printing and communications. However these applications tend to require high beam quality, in particular with single transverse mode operation where the polarisation state is fixed to a precise direction. Although VCSELs can be formed to generate circular beams and integrated in two dimensional arrays, they suffer from strong optical nonlinearities associated with their high gain operation and strong thermal effects. Such nonlinearities can cause not just strong multimode operation but also filamentary action across the emitting region. This behaviour thus causes beams to be generated with poor far fields and with multiple intensity peaks emitting in poorly defined polarisation states, which can vary with temperature and bias current.

Previous methods for controlling the polarisation state of light emitted from surface-emitting lasers have included the use of anisotropic cavity geometries which may cause distortion of the output beam shape. Introduction of anisotropic stress, gain or loss has also been used for control of polarisation state along pre-defined directions, though complete control is not usually maintained over the entire device operating range.

Temperature detuning of non-degenerate cavity modes has been used for complete polarisation control but this is achieved at the expense of reducing the gain, thereby increasing the device threshold current and power consumption and reducing the available power output. This effect is strongly dependent on the spectral splitting of orthogonal polarisation states, which may be influenced by the residual strain in a device. Therefore an additional technique maybe required to control the spectral splitting if a sufficient gain difference is to be achieved between the two states.

Integration of additional structures with the laser, for example gratings, can provide polarisation control but significantly increase the complexity of the device, and such structures can influence the spatial output characteristics of the laser emission.

SUMMARY OF THE PRESENT INVENTION

According to one aspect of the present invention there is provided a vertical cavity surface emitting laser device having a discontinuity formed within the body of the device, such that, when the device is in use, the direction of polarisation of light emitted from the device is substantially aligned with a boundary of the discontinuity.

The discontinuity may be formed by a void. The void may be provided by an elongated trench which extends into the body of the device from an outer surface thereof.

When the body of the device is of a first material, the discontinuity may be formed by a region of a second material, the second material being different to the first material.

Such a device may comprise a plurality of such discontinuities, the polarisation direction of light emitted by the device when in use being determined by the discontinuities.

A pair of substantially parallel elongate discontinuities may be provided, the direction of polarisation of the emitted light being substantially aligned with the direction of the boundary of the discontinuities which is closest to the light output region.

Alternatively, a pair of substantially mutually orthogonal elongate discontinuities may be used.

According to another aspect of the present invention, there is provided, a vertical cavity surface emitting laser device comprising a substrate, a lower mirror structure carried by the substrate, an active region carried by the lower mirror structure, and an upper mirror structure carried by the active region, and a contact region carried by the upper mirror structure, the contact region defining an aperture through which laser light is emitted when the diode is in use, wherein a discontinuity is defined within the device, such that the polarisation direction of such emitted light is substantially aligned with a boundary of the discontinuity.

In such a device at least one of the mirror structures may be a distributed Bragg reflector structure.

The discontinuity may be provided by a void.

The void may be provided by a trench region which extends through the contact region into the device towards the active region.

The trench region may be formed by etching the device structure, or by laser ablation of the device structure, or by electron beam lithography.

The semiconductor material of the device preferably allows light emission in the 400 nm–4000 nm wavelength range.

According to another aspect of the present invention, there is provided a method of polarising light comprising forming a discontinuity in the body of a vertical cavity surface emitting laser device, such that the polarisation direction of light emitted from the device when in use is substantially aligned with a boundary of the discontinuity.

DETAILED DESCRIPTION OF THE PREFERRED EMBODIMENTS

Figure 3:
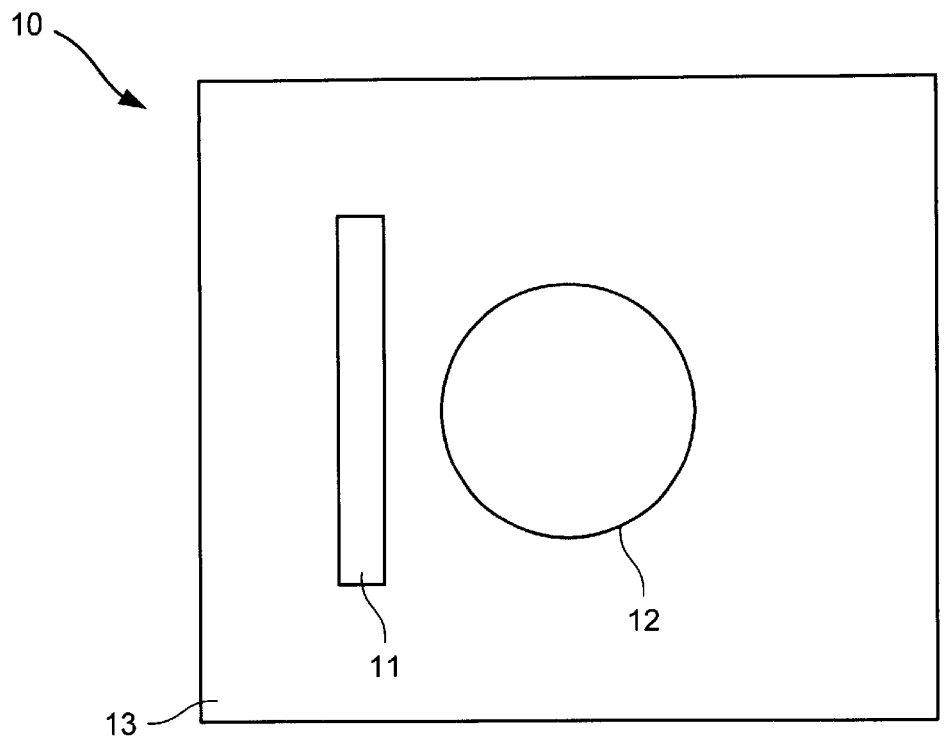
FIGS. 3 and 4 show plan and cross-sectional views of a preferred embodiment of the present invention.
Figure 4:
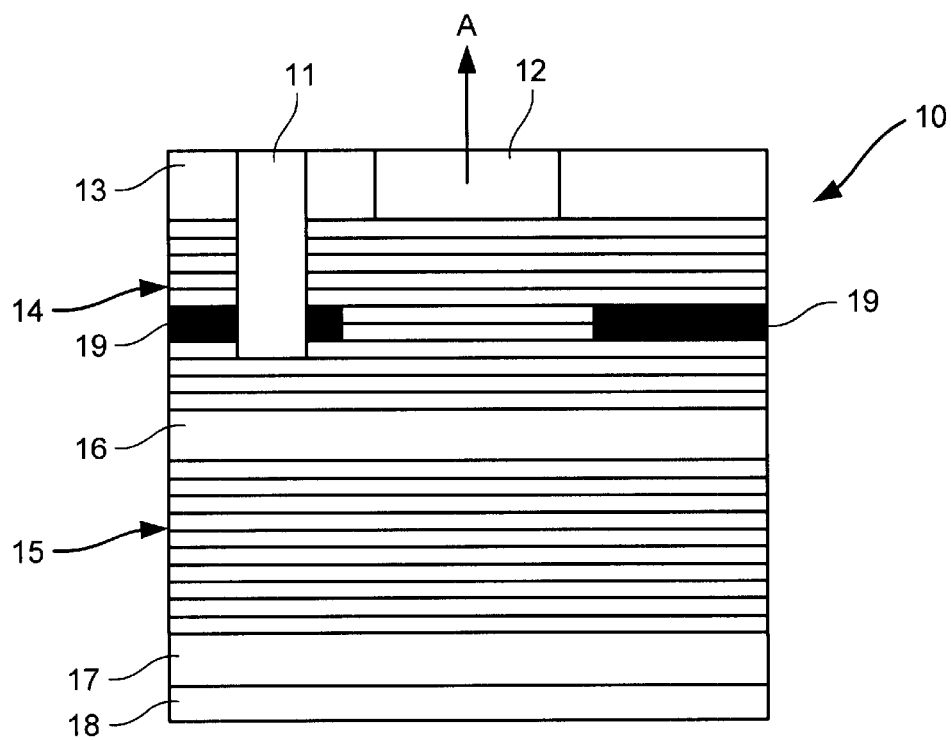

FIGS. 3 and 4 of the accompanying drawings show plan and cross-sectional views respectively of a VCSEL diode 10 embodying the present invention.

As described with reference to a known device above, the VCSEL 10 comprises a pair of electrodes 13 and 18, a substrate material 17, and an active area 16 which is sandwiched between upper and lower DBR mirror structures 14 and 15. The upper DBR mirror structure incorporates a proton implant area 19. The upper electrode 13 defines a circular aperture 12 through which laser light is emitted in the direction of arrow A.

Figure 1:
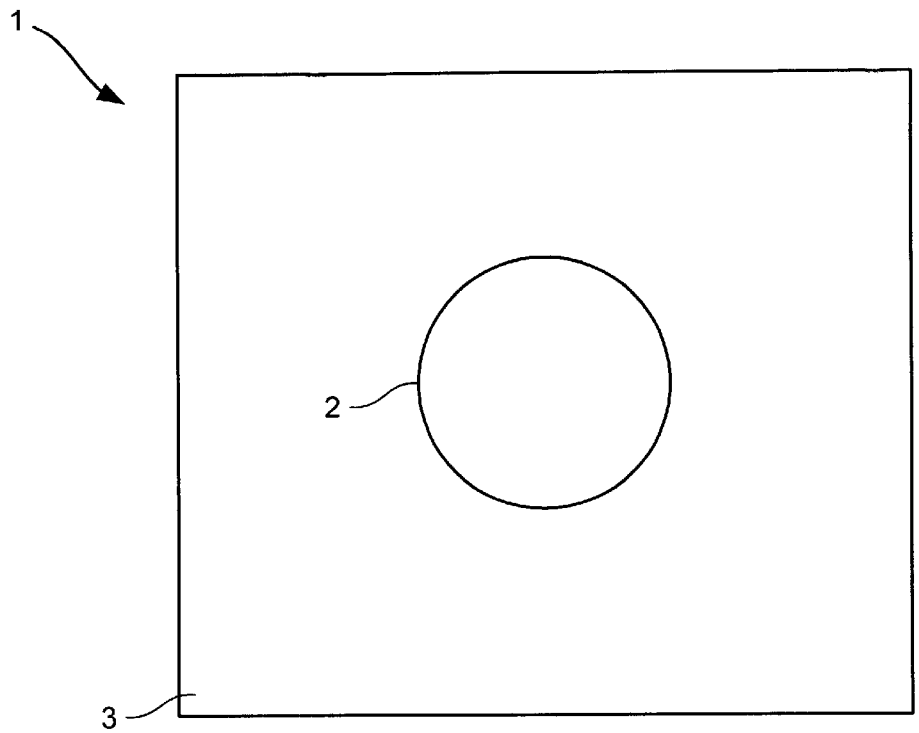
FIGS. 1 and 2 show plan and cross-sectional views respectively of a known VCSEL diode.
Figure 2:
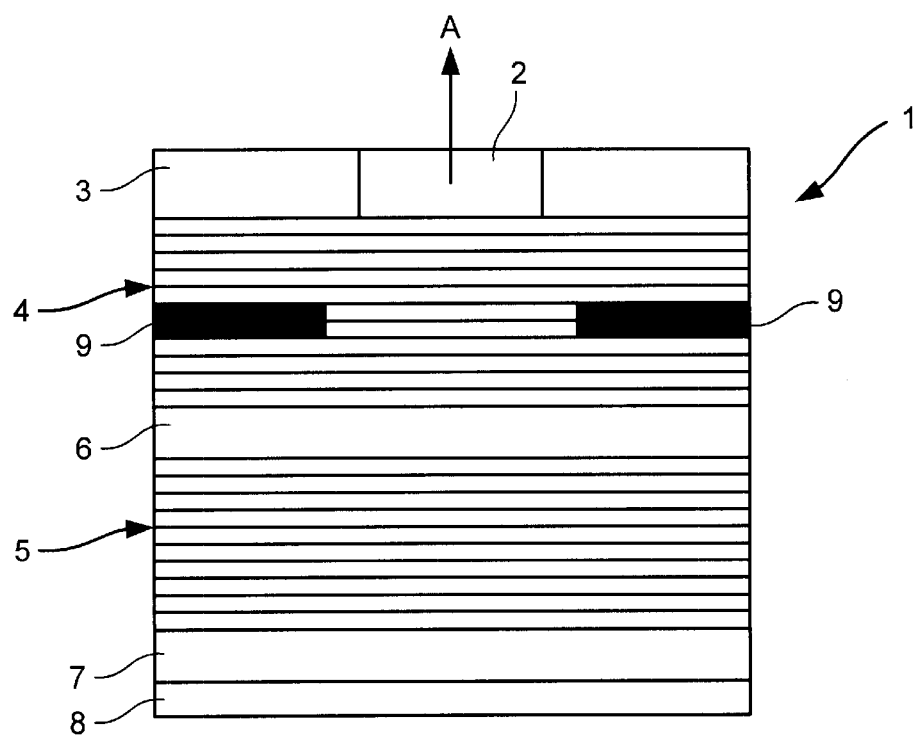

The VCSEL shown in FIGS. 3 and 4 operates substantially in accordance with the known device of FIGS. 1 and 2, in as much as a lasing effect is produced in the active area 16 between the two mirror structures 14 and 15. Light produced by this effect is then emitted through the aperture 12, as before.

However, in the present invention, polarisation control of the emitted laser light is achieved by the introduction of a discontinuity into the device. In the device shown in FIG. 4, the discontinuity is provided by an etched trench 11 which extends through the upper electrode 13 into the DBR mirror structure 14, toward the active region 16.

The etched trench adjacent to the lasing aperture is preferably positioned at a distance of up to 10 microns from the edge of the aperture (FIG. 4).

The trench discontinuity can be introduced by masking and etching techniques, or other techniques such as micromachining, laser ablation, e-beam lithography, X-ray or reactive ion etching (RIE), and may be carried out on completed devices.

Other geometries and positions for such etches may also produce desirable results.

The discontinuity can be provided by means other than a trench. For example, a void within the diode structure can be provided, or a material different to that of the structure can be used, such as a metal or an oxide. The trench (or void) could be filled with such a material. The discontinuities described in this description are merely exemplary, and the skilled person will be able to design further discontinuities within the scope of the invention.

The orientation of the discontinuity may be varied to tune the polarisation state of emission to a preferred/desired orientation. The angle of the discontinuity profile from the normal to the plane of the device emission plane can vary, as can its depth, allowing penetration through other layers such as the active region 16 and the lower mirror structure 15. The width, length and shape of the refractive index discontinuity 11 can also vary.

The introduction of a trench modifies the stress and strain experienced by the device, which controls the polarisation dependence of the emitted light beam. There also appear to be boundary effects that control the polarisation.

The introduction of trenches seems also to introduce a further effect which causes a polarisation dependence of the optical mode density and results in the spontaneous emission displaying a similar polarisation dependence to the lasing emission.

The use of a trench or other discontinuity allows the axis of the dominant polarisation to be set at any desired orientation, independent of any pre-existing effect, such as orientation of the crystal axes. The polarisation of the output light beam aligns with the direction of the closest boundary of the discontinuity to the aperture.

In general terms, a deep trench has more effect on the polarisation pinning than a shallow trench. A trench which is close in to the aperture 12 will have more effect than a trench which is spaced apart from the aperture.

This method of achieving polarisation control is applicable to optically pumped and electrically pumped laser devices.

The semiconductor material used for devices according to the invention preferably allows emission in the 400 nm–4000 nm wavelength range.

The polarisation control of the invention need not significantly degrade the quality of the spatial, spectral and power output characteristics of the laser, nor the electrical characteristics of the laser, as will be illustrated below.

Figure 5:
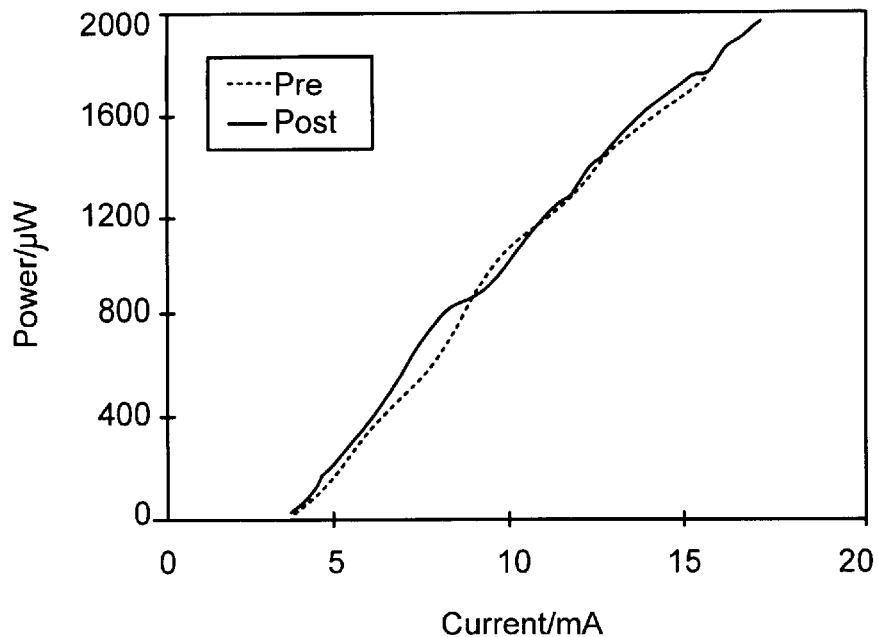
FIG. 5 is a graph comparing light current L-I characteristics of a known VCSEL and a VCSEL embodying the present invention.
Figure 6:
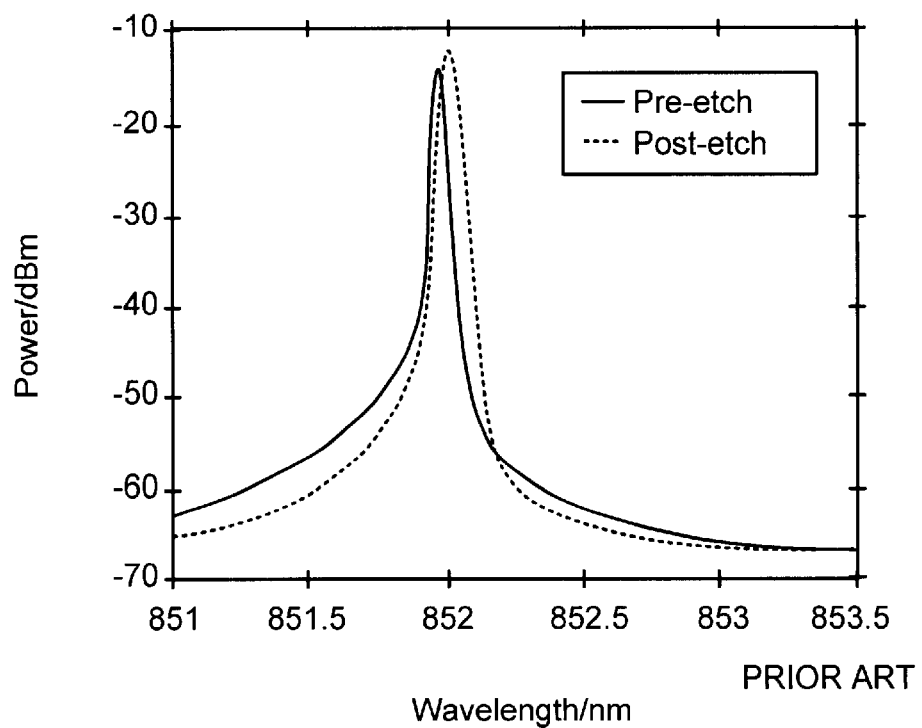
FIG. 6 is a graph of L-I characteristics of a known laser diode.
Figure 7:
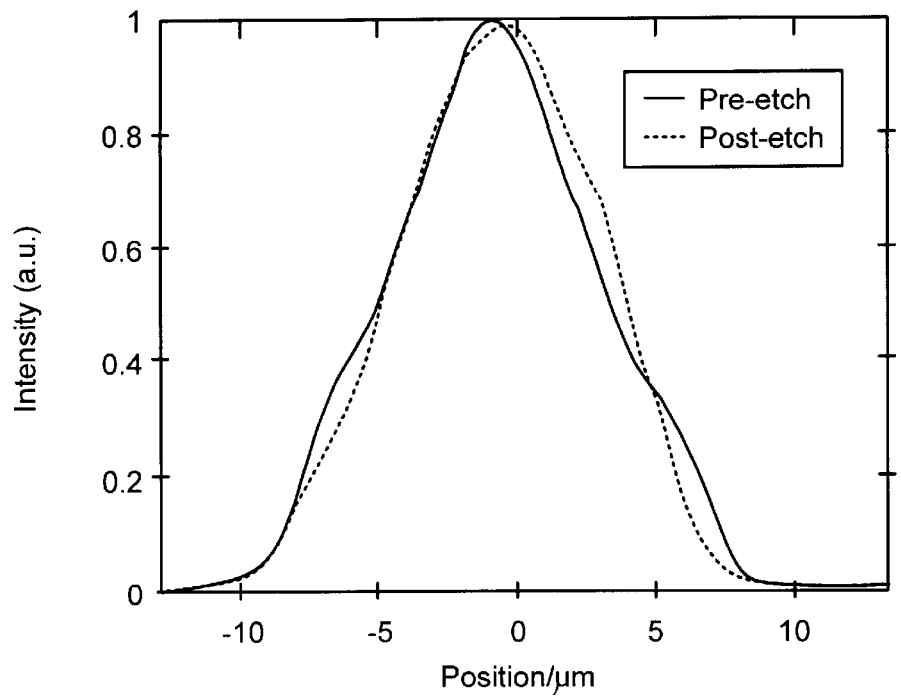
FIG. 7 shows the L-I characteristics of an embodiment of the present invention.

FIGS. 5, 6 and 7 show that the key performance areas of the device are not seriously degraded by the method for polarisation control, with no degradation of the light power output/current characteristics, the optical spectrum or the spatial output.

Figure 8:
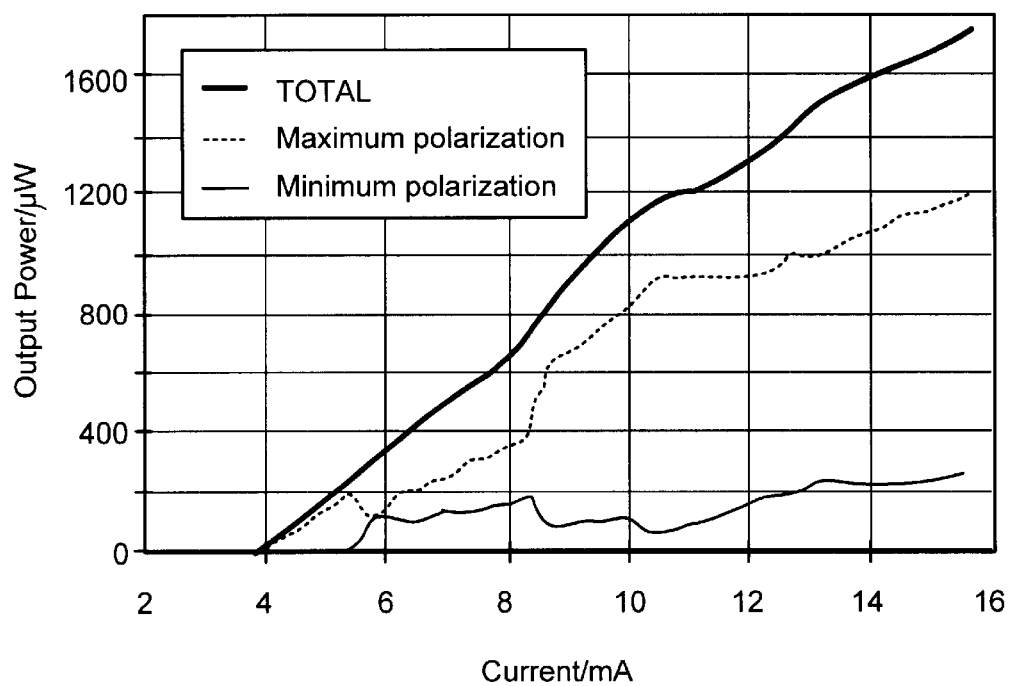
FIGS. 8, 9 and 10 are graphs illustrating the above-threshold polarisation dependent power measurements of an embodiment of the present invention.

FIG. 8 shows the L-I characteristics for a typical proton implanted VCSEL, in which poor single polarisation operation occurs. Here, on the onset of higher order transverse modes, switching of the polarisation state is observed, and at high currents both polarisations occur together.

Figure 9:
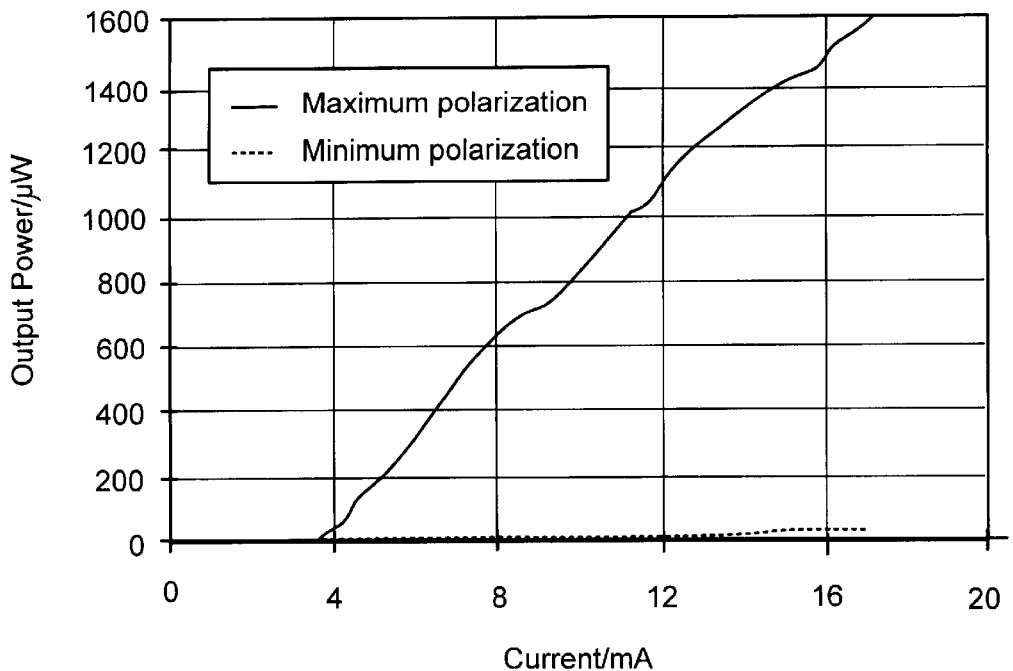
Figure 10:
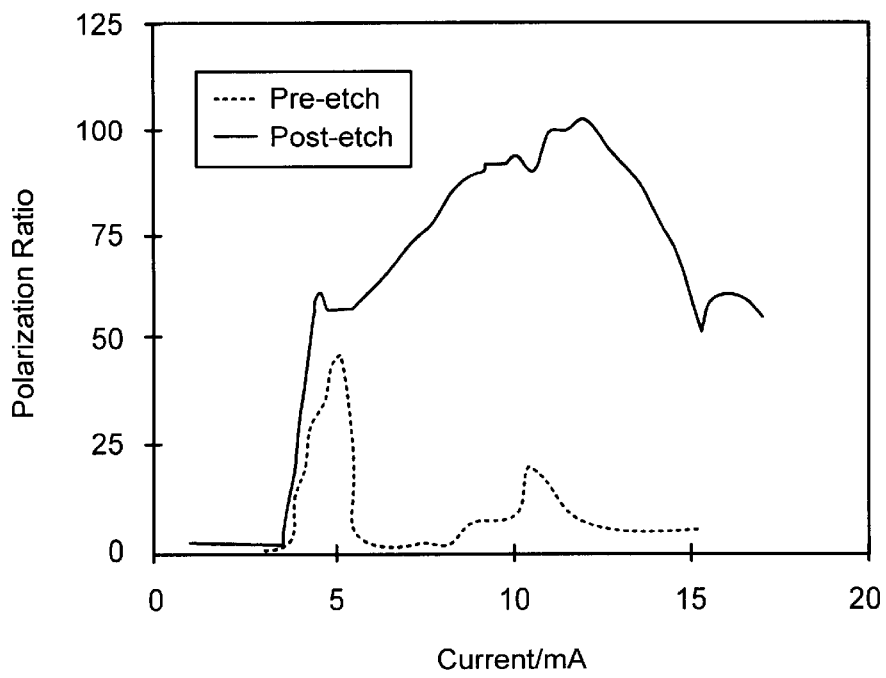

FIGS. 9 and 10 show the influence of polarisation control on the above-threshold polarisation dependent power measurements, showing how emission from one polarisation state remains highly suppressed over the entire device operating range in a device embodying the invention. Following the etching of a trench, 1 micron wide, 7 microns from the edge of the aperture and between 4 and 4.5 microns deep, single polarisation operation is forced (FIG. 9).

This is achieved with minimal change in threshold current or device efficiency. The polarisation state of emission remains fixed throughout the device bias current operating range, with the dominant E field polarisation parallel to the etch direction. Polarisation extinction ratios in excess of 100 (FIG. 10) are achieved and only found to reduce significantly on the onset of thermal roll off. Indeed the etching of the trench is found to polarise the spontaneous emission significantly, causing extinction ratios as high as 1.5 at low drive currents in the centre of the etch, rising to 3 at the etch. The pinning mechanisms are very strong, unlike in other devices, causing immediate single polarisation operation immediately from turn-on when a device is pulsed rather than the initial polarisation competition before a steady state equilibrium is reached in non-controlled devices. Despite the proximity of the etch to the aperture, no adverse effects are seen in terms of lifetime.

This technique has been applied to a wide range of devices and is found to be always successful. The polarisation direction in all cases aligns itself along the etch direction and remains fixed in this direction at least to within 5 degrees, this being the limit of accuracy of the measurement.

Figure 11:
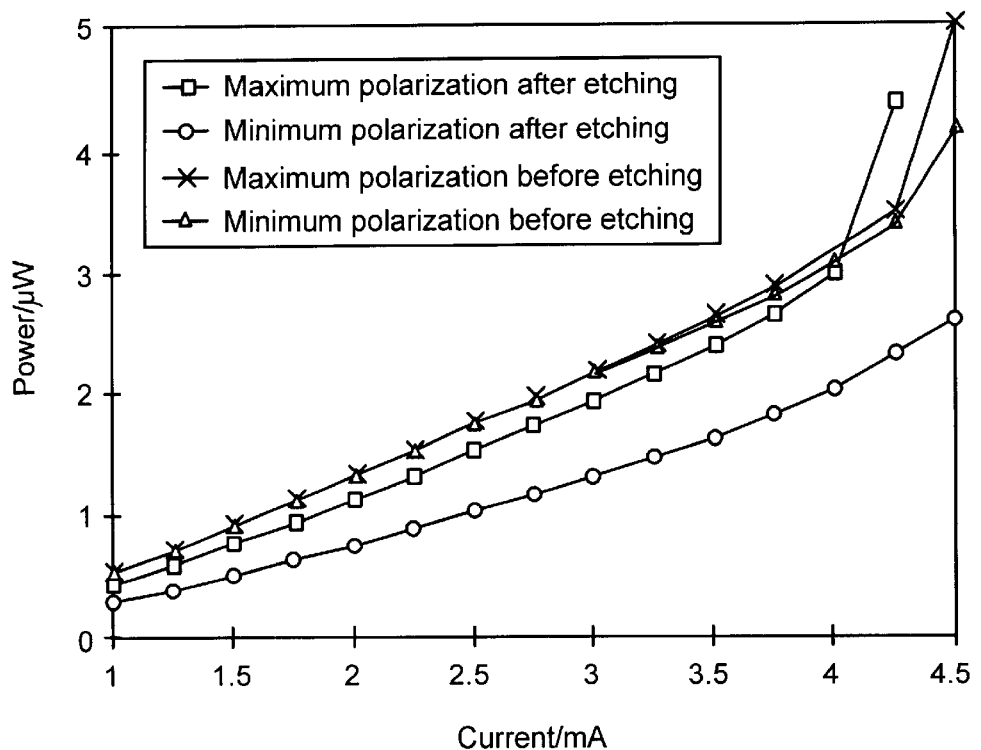
FIG. 11 is a graph comparing sub-threshold polarisation dependent L-I characteristics of a known laser diode with a diode embodying the present invention.
Figure 12:
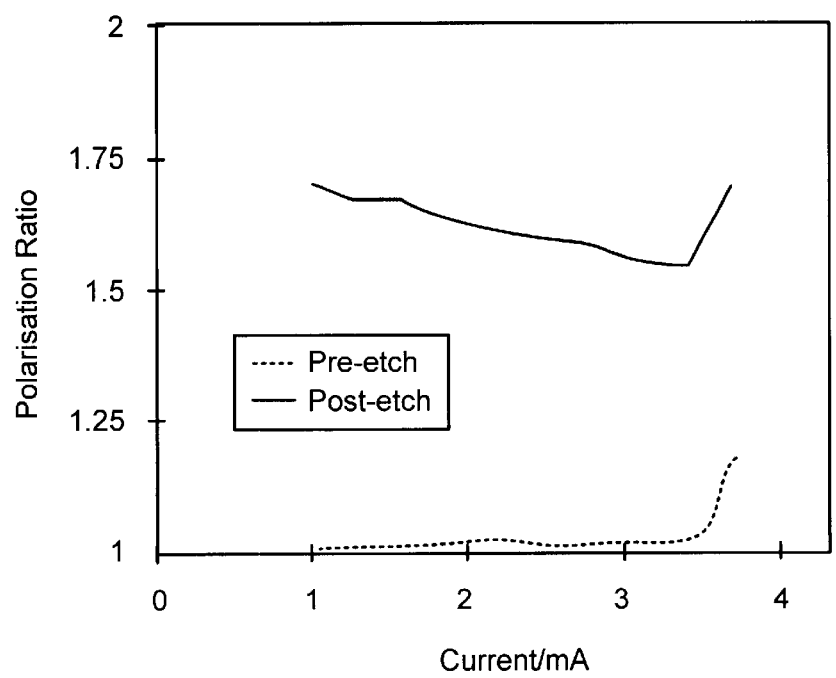
FIG. 12 is a graph of sub-threshold polarisation ratio measurements of a known laser diode and a laser diode embodying the invention.

FIGS. 11 and 12 show the influence of etching on the sub-threshold polarisation-dependent power from the cavity aperture of respective modified VCSEL devices, showing that modification results in unequal splitting between the two polarisation states, even at bias currents well below threshold.

Figure 13:
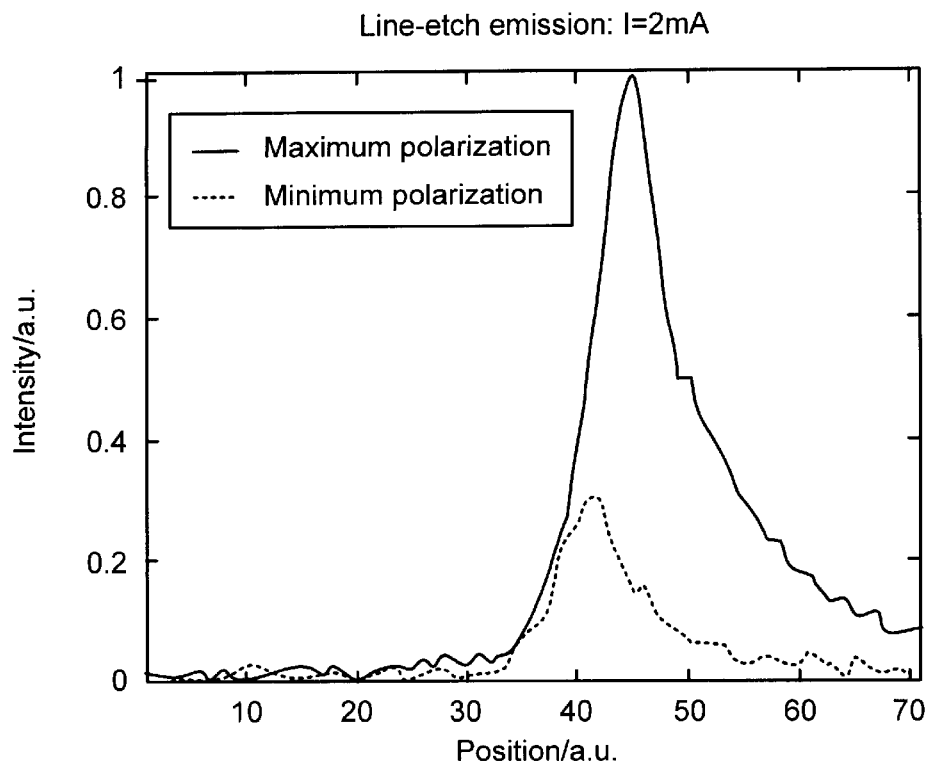
FIG. 13 is a graph illustrating cross-section through line emission showing the polarisation dependency of output power of an embodiment of the present invention.

FIG. 13 shows that power measurements of the spontaneous emission from the etched line display a high polarisation dependency.

Figure 14:
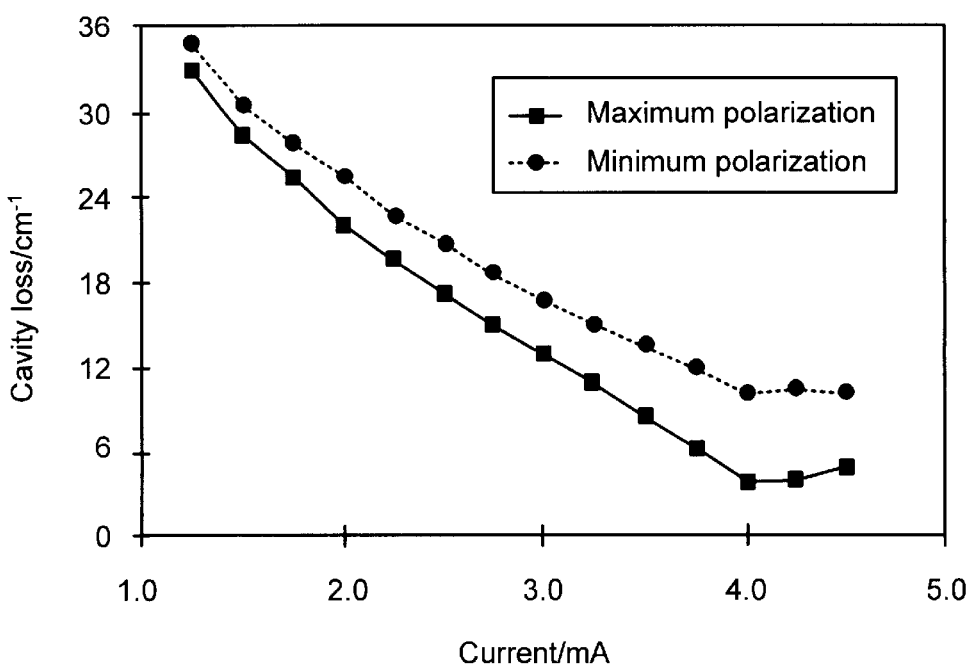
FIG. 14 is a graph indicating polarisation resolved cavity loss measurements of a laser diode embodying the present invention.
Figure 15:
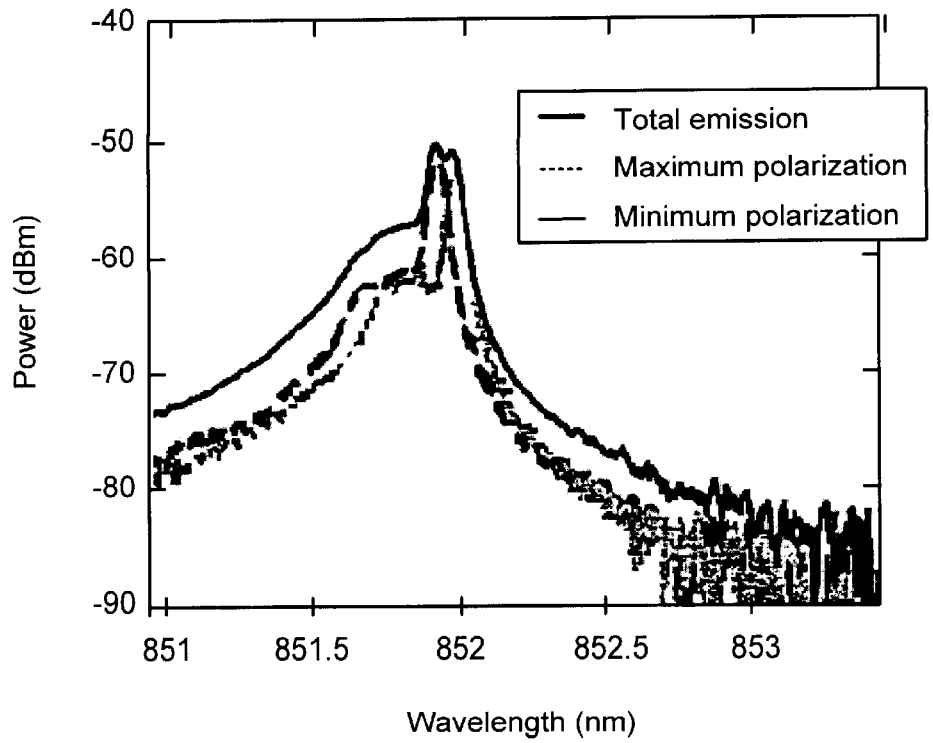
FIG. 15 is a graph illustrating sub-threshold optical spectra of a laser diode device embodying the present invention.

FIG. 14 shows the introduction of polarisation dependent cavity loss, related to the sub-threshold line width of emission and FIG. 15 shows spectral splitting of the orthogonal polarisation states, introduced through modification of the laser.

As the etches applied adjacent to the emitting aperture do not strongly affect the lasing mode, high spectral quality circuit output beam characteristics can be obtained for the single-mode operating regime of multimode devices as well as for monomode devices. In addition, longitudinal monomode operation, if achieved before polarisation pinning, is retained (FIG. 15). A small shift in line width is observed though this is small (<0.2 nm), the dominant polarisation being observed at the shorter wavelength. This shows that the polarisation pinning mechanism can cause enhanced birefringence in the system.

Successful pinning of polarisation requires trenches to be formed of sufficient depth, and these must at least pass through the top metallic contact layers into the semiconductor material. The minimum depth required for pinning depends on the distance of the trench from the aperture and also the direction of the trench with respect to that of the existing polarisation direction, as the pinning mechanism has to overcome existing polarisation selection mechanisms before setting the polarisation to it own direction. The depth must also be sufficiently great in multimode devices to ensure that all modes are polarised, care being required in this respect as higher order modes frequently are generated with orthogonal polarisations.

An assessment of the cavity losses associated with each polarisation state has been carried out by measuring the polarisation-resolved line widths below threshold. It can be seen from FIG. 14 that the measured cavity losses experienced by the dominant polarisation state are smaller than those for the highly suppressed state. Prior to etching, the spectral splitting was not observed and the cavity losses of the two polarisation states were found to be similar. Indeed optical injection measurements, where the photogenerated current from a VCSEL when used as a detector is measured have shown there to be a polarisation dependent absorption after etching, this indicating a modification in the band-edge driven probably by a strain dependent effect.

Figure 16:
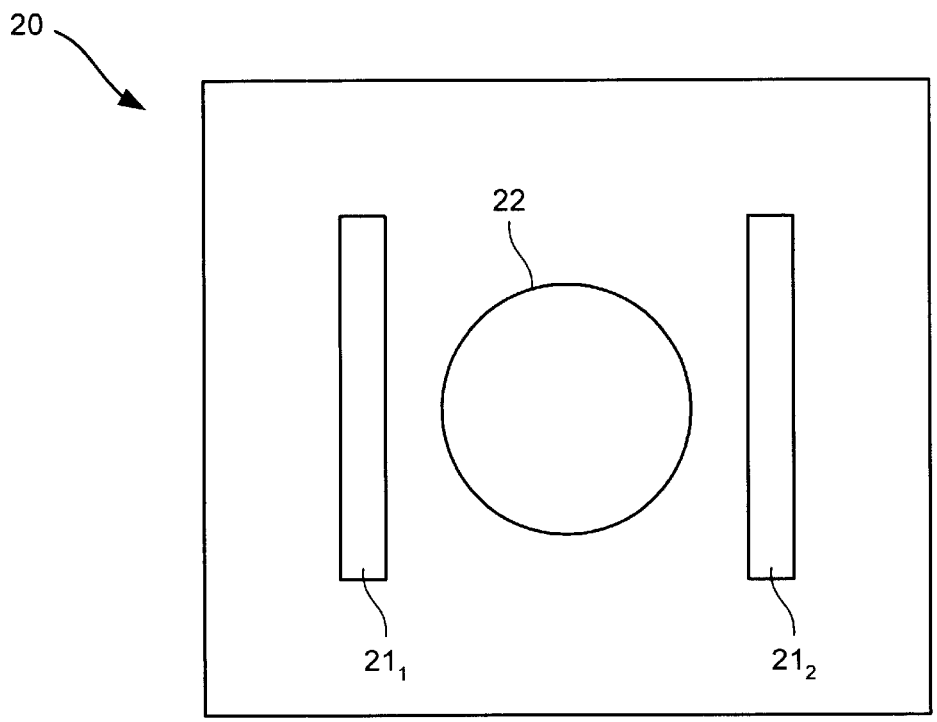
FIG. 16 shows a plan view of a second laser diode embodying the present invention.
Figure 17:
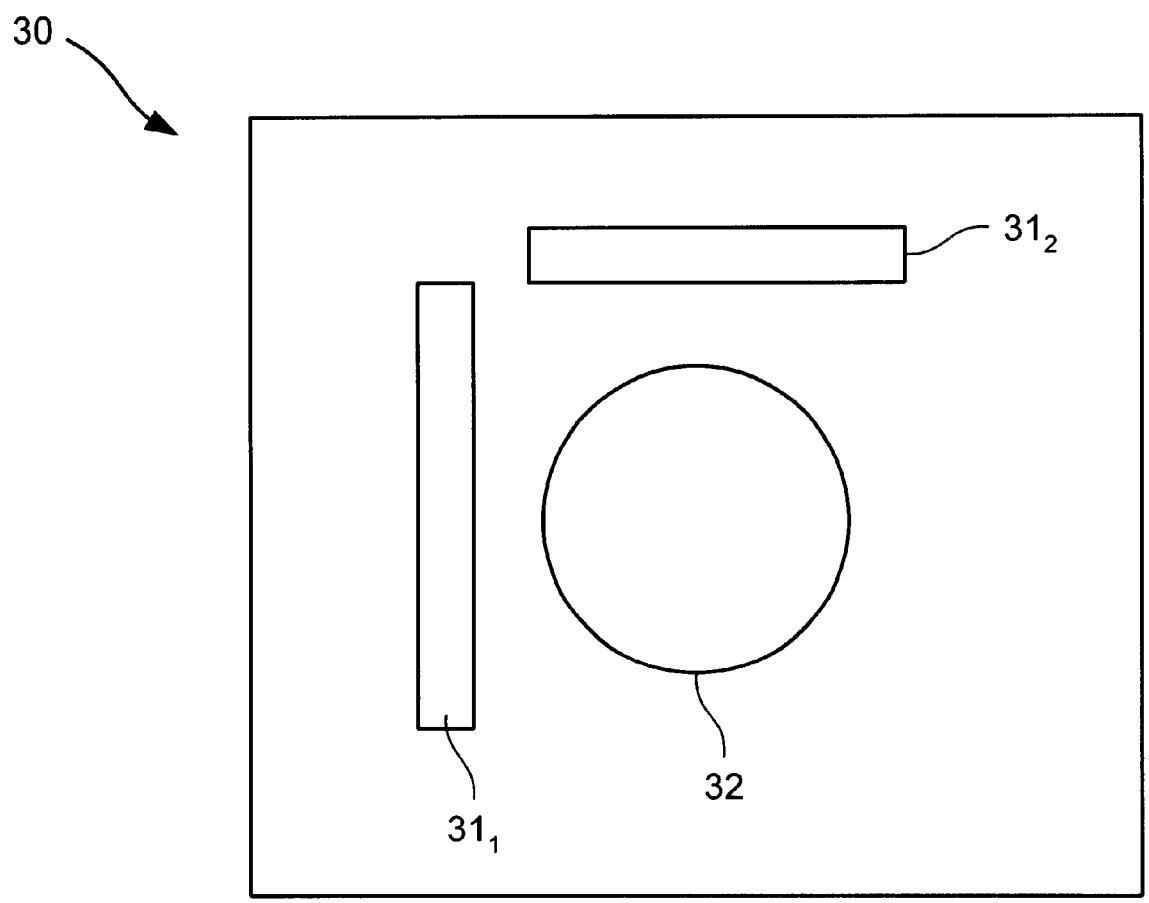
FIG. 17 shows a plan view of a third laser diode embodying the present invention.

A laser diode embodying the present invention may incorporate more than one discontinuity, for example as shown in FIGS. 16 and 17. In FIG. 16, a VCSEL device 20 is shown having two parallel discontinuities $21_1$ and $21_2$, one to each side of the aperture 22 of the device. FIG. 17 shows a VCSEL device 30 having a pair of orthogonal etches $31_1$ and $31_2$ adjacent to the aperture 32.

In the example shown in FIG. 16, the polarisation direction will align with the direction of the two discontinuities. The FIG. 17 example can be used to set the cavity gain of two orthogonal polarisations to be equal.

What is claimed is:

1. A vertical cavity surface emitting laser device, comprising:
    a substrate;
    a lower mirror structure adjacent to the substrate;
    an active region adjacent to the lower mirror structure;
    an upper mirror structure adjacent to the active region;
    a contact region adjacent to the upper mirror structure, wherein the contact region defines an aperture through which laser light can be emitted; and
    a discontinuity formed within the contact region, wherein the direction of polarization of light emitted from the device is substantially aligned with a boundary of the discontinuity.

2. A device as claimed in claim 1, wherein at least one of the mirror structures is a distributed Bragg reflector structure.

3. A device as claimed in claim 1, wherein the discontinuity comprises a void.

4. A device as claimed in claim 3, wherein the void comprises an elongate trench, and wherein the trench extends into the device from an outer surface thereof.

5. A device as claimed in claim 1, wherein the discontinuity comprises a region of a material different to the material of the device.

6. A device as claimed in claim 1, wherein the discontinuity is a plurality of discontinuities, and wherein the plurality of discontinuities are capable of determining the direction of polarization of light emitted by the device.

7. A device as claimed in claim 6, wherein the plurality of discontinuities comprises a pair of substantially parallel elongate discontinuities, and wherein the direction of polarization of the emitted light is substantially aligned with the elongate direction of the discontinuities.

8. A device as claimed in claim 6, wherein the plurality of discontinuities comprises a pair of substantially orthogonal elongate discontinuities.

9. A device as claimed in claim 1, wherein the discontinuity comprises a trench region, and wherein the trench region extends through the contact region into the upper mirror structure.

10. A device as claimed in claim 9, the trench region having been formed by etching the device structure.

11. A device as claimed in claim 9, the trench region having been formed by laser ablation of the device structure.

12. A device as claimed in claim 10, the trench region having been formed by an electron beam lithography technique.

13. A device as claimed in claim 1, further comprising semiconductor material which allows light emission in the 400 nm–4000 nm wavelength range.

14. A method of polarizing light, the method comprising:
   providing a vertical cavity surface emitting laser device, the device comprising:
      a substrate;
      a lower mirror structure adjacent to the substrate;
      an active region adjacent to the lower mirror structure;
      an upper mirror structure adjacent to the active region; and
      a contact region adjacent to the upper mirror structure, wherein the contact region defines an aperture through which laser light can be emitted; and
   forming a discontinuity in the contact region, wherein the direction of polarization of light emitted from the device is substantially aligned with a boundary of the discontinuity.

15. A method as claimed in claim 14, wherein forming a discontinuity comprises forming a void in the contact region.

16. A method as claimed in claim 15, wherein forming a void comprises forming a trench region in the device, and wherein the trench region extends from an outer surface of the device.

17. A method as claimed in claim 15, wherein forming a discontinuity further comprises filling the void with a material different from that from which the device is manufactured.

18. A method as claimed in claim 14, wherein forming a discontinuity comprises forming a plurality of discontinuities within the contact region, wherein the direction of polarization of light emitted from the device is determined by the discontinuities.

19. A method as claimed in claim 18, wherein the plurality of discontinuities comprises a pair of substantially parallel elongate discontinuities, and wherein the direction of polarization of the emitted light is substantially aligned with the elongate direction of the discontinuities.

20. A method as claimed in claim 18, wherein the plurality of discontinuities comprises a pair of substantially orthogonal elongate discontinuities.

21. A vertical cavity surface emitting laser device comprising:
   a substrate;
   a lower mirror structure adjacent to the substrate;
   an active region adjacent to the lower mirror structure;
   an upper mirror structure adjacent to the active region;
   a contact region adjacent to the upper mirror structure, wherein the contact region defines an aperture through which laser light can be emitted; and
   a trench region which extends through the contact region into the device towards the active region, wherein the direction of polarization of light emitted from the device is substantially aligned with a boundary of the trench region.

22. A device as claimed in claim 21, wherein the trench region is filled with a material different from the material from which the device is manufactured.

23. A method as claimed in claim 15, wherein the void comprises a trench region which extends though the contact region into the device toward the active region.

24. A method as claimed in claim 14, wherein the discontinuity comprises a trench region, and wherein the trench region extends through the contact region into the upper mirror structure.

* * * * *